(12) United States Patent
Chen et al.

(10) Patent No.: US 10,629,135 B2
(45) Date of Patent: Apr. 21, 2020

(54) ARRAY SUBSTRATE, MANUFACTURING METHOD THEREOF, DRIVING METHOD, DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Yulong Chen, Beijing (CN); Niannian Wang, Beijing (CN); Yong Xiong, Beijing (CN); Xiang Zhang, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/333,163

(22) PCT Filed: Jul. 5, 2018

(86) PCT No.: PCT/CN2018/094614
§ 371 (c)(1),
(2) Date: Mar. 13, 2019

(87) PCT Pub. No.: WO2019/042011
PCT Pub. Date: Mar. 7, 2019

(65) Prior Publication Data
US 2019/0244570 A1  Aug. 8, 2019

(30) Foreign Application Priority Data
Aug. 30, 2017  (CN) .......................... 2017 1 0765829

(51) Int. Cl.
G09G 3/36 (2006.01)
G09G 3/30 (2006.01)
(Continued)

(52) U.S. Cl.
CPC ......... *G09G 3/3275* (2013.01); *G09G 3/3208* (2013.01); *G09G 3/3611* (2013.01);
(Continued)

(58) Field of Classification Search
CPC .... G09G 2310/0264–0297; G09G 3/30–3696; G09G 2300/04–0895
See application file for complete search history.

(56) References Cited

U.S. PATENT DOCUMENTS

| 9,047,816 B2 | 6/2015 | Oh |
| 2008/0062108 A1 | 3/2008 | Kim |

(Continued)

FOREIGN PATENT DOCUMENTS

| CN | 101140943 | 3/2008 |
| CN | 101566771 | 10/2009 |
| CN | 107369694 | 11/2017 |

OTHER PUBLICATIONS

International Search Report and Written Opinion for PCT/CN2018/094614 dated Sep. 26, 2018 with translation, 10 pages.
(Continued)

*Primary Examiner* — Sanghyuk Park
(74) *Attorney, Agent, or Firm* — Myers Bigel, P.A.

(57) ABSTRACT

An array substrate, a manufacturing method thereof, a driving method, and a display device are provided. The array substrate includes a plurality of gate lines and a plurality of data lines whose extension directions intersect each other, a plurality of pixel units defined by the plurality of gate lines and the plurality of data lines, and a plurality of auxiliary electrode lines arranged alternately with the plurality of gate
(Continued)

lines. Each pixel unit includes a first transistor, a second transistor, and a pixel electrode. The array substrate further includes a third transistor disposed between each gate line and an auxiliary electrode line adjacent thereto, a control terminal of the third transistor being electrically connected to a data line, a first terminal of the third transistor being electrically connected to the gate line, and a second terminal of the third transistor being electrically connected to the auxiliary electrode line.

20 Claims, 6 Drawing Sheets

(51) Int. Cl.
    *G09G 3/3275*     (2016.01)
    *H01L 27/12*     (2006.01)
    *H01L 27/32*     (2006.01)
    *H01L 21/77*     (2017.01)
    *G09G 3/3208*     (2016.01)

(52) U.S. Cl.
    CPC ........... *G09G 3/3677* (2013.01); *H01L 21/77* (2013.01); *H01L 27/124* (2013.01); *H01L 27/1255* (2013.01); *H01L 27/1259* (2013.01); *H01L 27/3276* (2013.01); *G09G 2300/0439* (2013.01)

(56) References Cited

U.S. PATENT DOCUMENTS

| | | | |
|---|---|---|---|
| 2009/0225018 A1* | 9/2009 | Kim | G09G 3/3659 345/90 |
| 2009/0268112 A1 | 10/2009 | Lu et al. | |
| 2014/0124745 A1* | 5/2014 | Jin | H01L 27/3276 257/40 |
| 2016/0246146 A1* | 8/2016 | Yao | G02F 1/134309 |
| 2017/0110074 A1* | 4/2017 | Xu | G02F 1/13624 |
| 2019/0244570 A1 | 8/2019 | Chen et al. | |

OTHER PUBLICATIONS

Office Action for corresponding CN application No. 201710765829.4 dated Mar. 13, 2019, with translation, 10 pages.

* cited by examiner

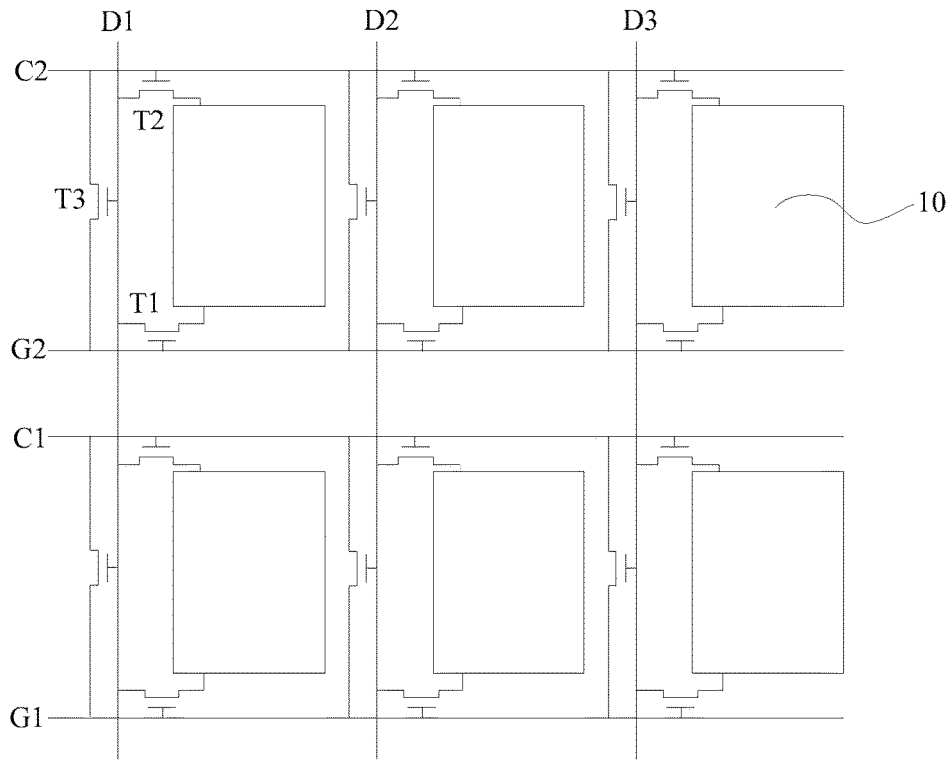

Fig.3 (b)

--- forming a first conductive layer and a second semiconductor layer on a base substrate, the first conductive layer including a plurality of gate lines and a plurality of auxiliary electrode lines alternately arranged, the second semiconductor layer including a third semiconductor pattern disposed between each gate line and an auxiliary electrode line adjacent thereto, the third semiconductor pattern being in electrical contact with both the gate line and the auxiliary electrode line — S100 forming an insulating layer — S101 forming a first semiconductor layer and a second conductive layer, the first semiconductor layer including a plurality of first semiconductor patterns and a plurality of second semiconductor patterns, orthographic projections of the first semiconductor pattern and the gate line on the base substrate overlapping each other, orthographic projections of the second semiconductor pattern and the auxiliary electrode line on the base substrate overlapping each other; the second conductive layer including a first source, a first drain, a second source, a second drain, and a plurality of data lines intersecting the extension direction of the gate lines, the first source and the first drain being both in electrical contact with the first semiconductor pattern, the second source and the second drain being both in electrical contact with the second semiconductor pattern, orthographic projections of the data line and the third semiconductor pattern on the base substrate overlapping each other — S102

ARRAY SUBSTRATE, MANUFACTURING METHOD THEREOF, DRIVING METHOD, DISPLAY DEVICE

CROSS REFERENCE TO RELATED APPLICATIONS

The present application is a 35 U.S.C. 371 national stage application of PCT International Application No. PCT/CN2018/094614, filed on Jul. 5, 2018, which claims the benefit of Chinese Patent Application No. 201710765829.4, filed on Aug. 30, 2017, the contents of which are incorporated herein by reference in their entireties. The above-referenced International Application was published in the Chinese language as International Publication No. WO 2019/042011 A1 on Mar. 7, 2019.

FIELD

The present disclosure relates to the field of display technologies, and particularly to an array substrate, a manufacturing method thereof, a driving method, and a display device.

BACKGROUND

A typical display device comprises an array substrate. A plurality of gate lines and a plurality of data lines are arranged on the array substrate, and the plurality of gate lines and the plurality of data lines are arranged in an intersecting manner to define a plurality of pixel regions (also referred to as sub-pixel regions). A thin film transistor (TFT) that controls pixel display is disposed at each intersection of the gate lines and the data lines.

SUMMARY

An aspect of the present disclosure provides an array substrate comprising a plurality of gate lines extending along a first direction, a plurality of data lines extending along a second direction intersecting the first direction, a plurality of pixel units defined by intersections of the plurality of gate lines and the plurality of data lines, and a plurality of auxiliary electrode lines arranged alternately with the plurality of gate lines and extending along the first direction. Each pixel unit includes a first transistor, a second transistor, and a pixel electrode. In each pixel unit, a control terminal of the first transistor is electrically connected to a gate line that drives a row of pixel units in which the pixel unit is located, a first terminal of the first transistor is electrically connected to a data line, and a second terminal of the first transistor is electrically connected to the pixel electrode; a control terminal of the second transistor is electrically connected to an auxiliary electrode line that drives a row of pixel units in which the pixel unit is located, a first terminal of the second transistor is to electrically connected to a data line, and a second terminal of the second transistor is electrically connected to the pixel electrode. The array substrate further comprises a third transistor disposed between each gate line and an auxiliary electrode line adjacent thereto, a control terminal of the third transistor being electrically connected to a data line, a first terminal of the third transistor being electrically connected to the gate line, and a second terminal of the third transistor being electrically connected to the auxiliary electrode line.

According to some exemplary embodiments of the present disclosure, the third transistor is disposed at each intersection of the plurality of gate lines and the plurality of data lines.

According to some exemplary embodiments of the present disclosure, the first terminal of the third transistor is electrically connected to the auxiliary electrode line that drives a row of pixel units in which the pixel unit is located, and the second terminal of the third transistor is electrically connected to a gate line that drives an adjacent row of pixel units.

According to some exemplary embodiments of the present disclosure, the first terminal of the third transistor is electrically connected to the auxiliary electrode line that drives a row of pixel units in which the pixel unit is located, and the second terminal of the third transistor is electrically connected to the gate line that drives a row of pixel units in which the pixel unit is located.

According to some exemplary embodiments of the present disclosure, a semiconductor layer of at least one of the first transistor, the second transistor, and the third transistor includes an amorphous silicon layer and a doped layer.

According to some exemplary embodiments of the present disclosure, the auxiliary electrode line is multiplexed into a common electrode line.

Another aspect of the present disclosure provides a display device comprising any of the array substrates described above.

A further aspect of the present disclosure provides a manufacturing method for an array substrate, comprising: forming a first conductive layer and a second semiconductor layer on a base substrate, the first conductive layer including a plurality of gate lines and a plurality of auxiliary electrode lines alternately arranged, the second semiconductor layer including a third semiconductor pattern disposed between each gate line and an auxiliary electrode line adjacent thereto, the third semiconductor pattern being in electrical contact with both the gate line and the auxiliary electrode line; forming a first semiconductor layer and a second conductive layer. The first semiconductor layer includes a plurality of first semiconductor patterns and a plurality of second semiconductor patterns, an orthographic projection of the first semiconductor pattern on the base substrate overlapping that of the gate line on the base substrate, an orthographic projection of the second semiconductor pattern on the base substrate overlapping that of the auxiliary electrode line on the base substrate. The second conductive layer includes a first source, a first drain, a second source, a second drain, and a plurality of data lines intersecting extension directions of the plurality of gate lines, the first source and the first drain being both in electrical contact with the first semiconductor pattern, the second source and the second drain being both in electrical contact with the second semiconductor pattern, an orthographic projection of the data line on the base substrate overlapping that of the third semiconductor pattern on the base substrate.

According to some exemplary embodiments of the present disclosure, prior to forming a first conductive layer and a second semiconductor layer on a base substrate, the manufacturing method further comprises: forming a third conductive layer on the base substrate, the third conductive layer including a plurality of pixel electrodes, each of which is electrically connected to a corresponding first drain and a corresponding second drain to be formed.

According to some exemplary embodiments of the present disclosure, after forming a first semiconductor layer and a second conductive layer on the base substrate, the manufacturing method further comprises: forming a third conductive layer, the third conductive layer including a plurality of pixel electrodes, each of which is electrically connected to the corresponding first drain and the corresponding second drain.

According to some exemplary embodiments of the present disclosure, the third semiconductor pattern is formed by a step of: forming the third semiconductor pattern at each intersection of the plurality of gate lines and the plurality of data lines.

Yet another aspect of the present disclosure provides a driving method for the array substrate described above, comprising: inputting a data signal to a pixel electrode connected to a first transistor and a second transistor through at least one of the first transistor and the second transistor.

According to some exemplary embodiments of the present disclosure, the first terminal of the third transistor is electrically connected to an auxiliary electrode line that drives a row of pixel units in which the pixel unit is located, and the second terminal of the third transistor is electrically connected to a gate line that drives an adjacent row of pixel units.

According to some exemplary embodiments of the present disclosure, gate scanning signals are input to the plurality of gate lines row by row, and inputting a data signal to a pixel electrode connected to a first transistor and a second transistor through at least one of the first transistor and the second transistor includes: inputting a data signal to the pixel electrode connected to the first transistor and the second transistor through the first transistor or the second transistor.

According to some exemplary embodiments of the present disclosure, gate scanning signals are input to each gate line and another gate line adjacent to the gate line simultaneously. Inputting a data signal to a pixel electrode connected to a first transistor and a second transistor through at least one of the first transistor and the second transistor includes: inputting a data signal to the pixel electrode connected to the first transistor and the second transistor through both the first transistor and the second transistor in response to the first transistor being undamaged, and inputting a data signal to the pixel electrode connected to the first transistor and the second transistor through the second transistor in response to the first transistor being damaged.

According to some exemplary embodiments of the present disclosure, an absolute value of a voltage of a gate scanning signal input to the gate line is larger than an absolute value of a voltage of a gate scanning signal input to said another gate line, and is configured to turn on the first transistor connected to the gate line, and the absolute value of the voltage of the gate scanning signal input to said another gate line is configured to turn on the second transistor through the third transistor, and not to turn on the first transistor connected to said another gate line.

According to some exemplary embodiments of the present disclosure, the first terminal of the third transistor is electrically connected to an auxiliary electrode line that drives a row of pixel units in which the pixel unit is located, and the second terminal of the third transistor is electrically connected to a gate line that drives a row of pixel units in which the pixel unit is located.

According to some exemplary embodiments of the present disclosure, gate scanning signals are input to the plurality of gate lines row by row, and inputting a data signal to a pixel electrode connected to a first transistor and a second transistor through at least one of the first transistor and the second transistor includes: inputting a data signal to the pixel electrode connected to the first transistor and the second transistor through both the first transistor and the second transistor in response to the first transistor being undamaged, and inputting a data signal to the pixel electrode connected to the first transistor and the second transistor through the second transistor in response to the first transistor being damaged.

According to some exemplary embodiments of the present disclosure, a third transistor is disposed at an intersection of a gate line and a data line, and is connected to a same data line as that to which a first transistor and a second transistor of a pixel unit defined by the intersection are connected.

According to some exemplary embodiments of the present disclosure, the third transistor is disposed on a first side of the data line, and the first transistor and the second transistor are disposed on a second side of the data line opposite to the first side along the first direction.

According to some exemplary embodiments of the present disclosure, for each pixel unit, an auxiliary electrode line connected to the pixel unit is disposed on a first side of the pixel unit, and a gate line connected to the pixel unit is disposed on a second side of the pixel unit opposite to the first side along the second direction.

BRIEF DESCRIPTION OF THE DRAWINGS

In order to more clearly illustrate the technical solutions in embodiments of the present disclosure or the prior art, the drawings required for description of the embodiments or the prior art will be briefly described below. Obviously, the drawings in the description below are just some embodiments of the present disclosure. Other drawings may also be obtained by those ordinarily skilled in the art based on these drawings without spending inventive efforts.

FIG. 4 is a flow chart of a manufacturing method for an array substrate provided by an embodiment of the present disclosure;

FIG. 7 (b) is a sectional view taken along line BB in FIG. 6;

DETAILED DESCRIPTION

The technical solutions in embodiments of the present disclosure will be clearly and completely described below with reference to the accompanying drawings. It is obvious that the described embodiments are only part of the embodiments of the present disclosure, rather than all of them. All other embodiments obtained by those ordinarily skilled in the art based on the embodiments of the present disclosure without spending inventive efforts fall within the scope of the present disclosure.

Figure 1:
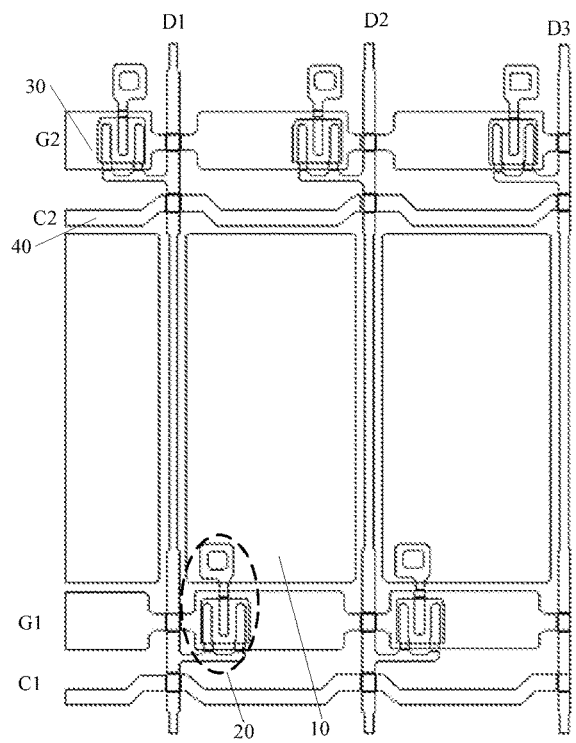
FIG. 1 is a schematic structural view of a typical array substrate.

A typical TFT array substrate, as shown in FIG. 1, comprises a plurality of gate lines G1, G2 and a plurality of data lines D1, D2, D3 which intersect each other, and a plurality of pixel regions (also referred to as sub-pixel regions) defined by the plurality of gate lines G1, G2 and the plurality of data lines D1, D2, D3. Each pixel region includes a transistor 20 and a pixel electrode 10. The transistor 20 is configured to control the input of a signal to the pixel electrode 10 to light the pixel.

The inventors have found that in the case where the transistor 20 is damaged, the pixel electrode 10 connected to the transistor 20 is out of control, so that the pixel controlled by the transistor 20 is in a constantly dark or bright state, and further becomes a dark spot visible to naked eyes. This seriously affects the product quality.

In view of this, an embodiment of the present disclosure provides an array substrate, as shown in FIG. 2(a), FIG. 2(b), FIG. 3(a) and FIG. 3(b), comprising a plurality of gate lines G1, G2, G3 . . . extending along a first direction, a plurality of data lines D1, D2, D3 . . . extending along a second direction intersecting the first direction, a plurality of pixel units defined by the plurality of gate lines and the plurality of data lines, and a plurality of auxiliary electrode lines C1, C2 . . . arranged alternately with the gate lines G1, G2, G3 . . . .

Each of the pixel units includes a first transistor T1, a second transistor T2, and a pixel electrode 10. A control terminal of the first transistor T1 is electrically connected to a gate line that drives a row of pixel units in which the pixel unit is located, a first terminal of the first transistor T1 is electrically connected to a data line, and a second terminal of the first transistor T1 is electrically connected to the pixel electrode 10. A control terminal of the second transistor T2 is electrically connected to an auxiliary electrode line of a row in which the pixel unit is located, a first terminal of the second transistor T2 is electrically connected to the data line, and the second terminal of the second transistor T2 is electrically connected to the pixel electrode. A third transistor T3 is disposed between a gate line and an auxiliary electrode line adjacent thereto. A control terminal of the third transistor T3 is electrically connected to a data line, a first terminal of the third transistor T3 is electrically connected to the gate line, and a second terminal of the third transistor T3 is electrically connected to the auxiliary electrode line.

It is to be noted that the gate lines and the auxiliary electrode lines are arranged alternately. Therefore, except for the outermost gate line and auxiliary electrode line, each of the gate lines has two adjacent auxiliary electrode lines, and each auxiliary electrode line has two adjacent gate lines. For example, as shown in FIG. 2(a), FIG. 2(b), FIG. 3(a) or FIG. 3(b), the auxiliary electrode line C1 and the auxiliary electrode line C2 are adjacent to the gate line G2, respectively, and the gate line G1 and the gate line G2 are adjacent to the auxiliary electrode line C1, respectively. A third transistor T3 being disposed between a gate line and an auxiliary electrode line adjacent thereto means that a third transistor T3 is disposed between the auxiliary electrode line C1 and the gate line G2, or between the auxiliary electrode line C2 and the gate line G2.

Figure 2:
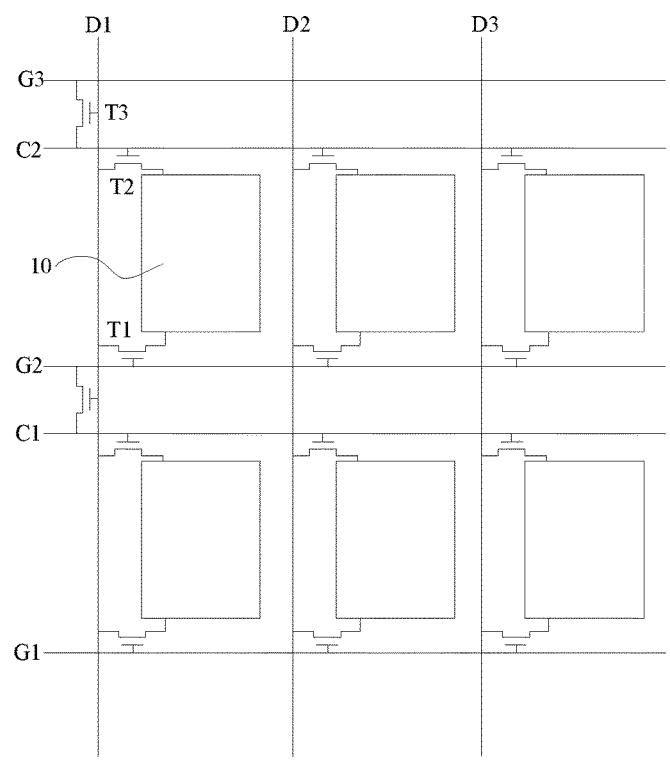
FIG. 2(a) is a schematic structural view of an array substrate provided by an embodiment of the present disclosure.
FIG. 2(b) is a schematic structural view of an array substrate provided by an embodiment of the present disclosure.
Figure 2:
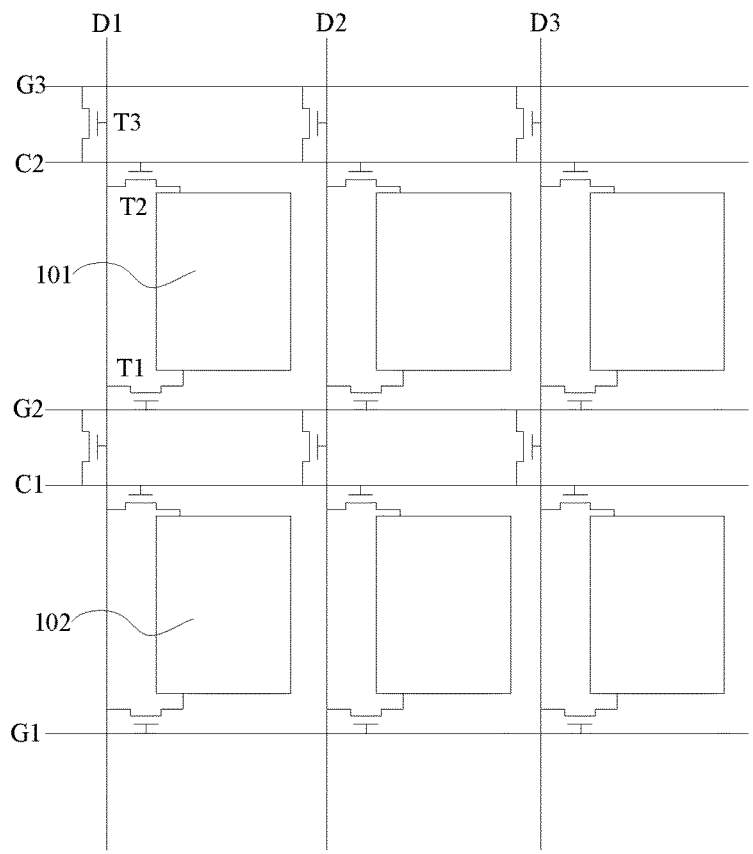
Figure 3:
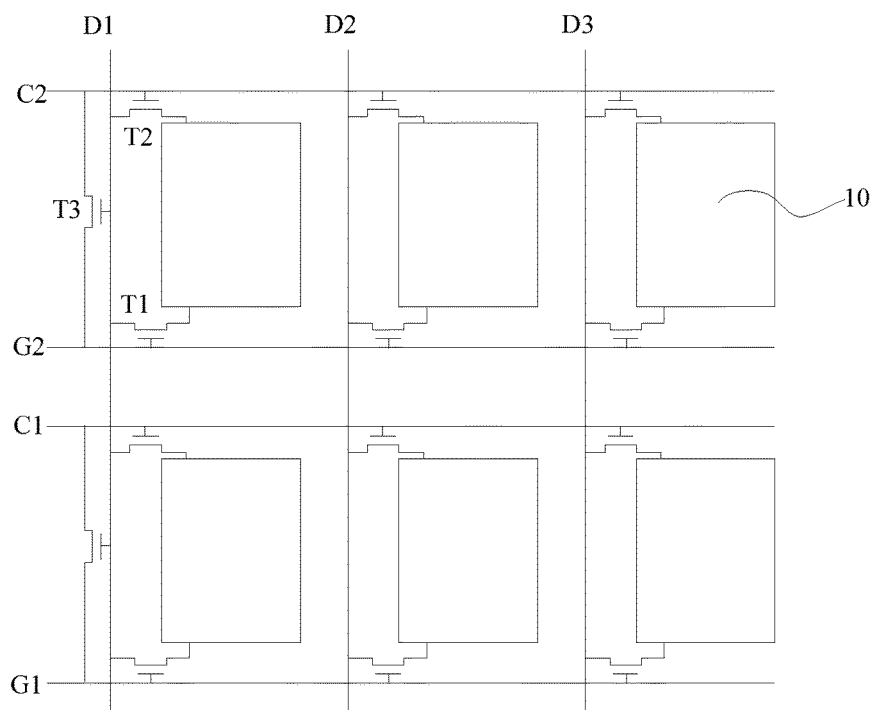
FIG. 3(a) is a schematic structural view of an array substrate provided by an embodiment of the present disclosure.
FIG. 3(b) is a schematic structural view of an array substrate provided by an embodiment of the present disclosure.

It is also to be noted that the number of third transistors T3 disposed between a gate line and an auxiliary electrode line adjacent thereto is not limited. For example, as shown in FIG. 2(a) and FIG. 3(a), only one third transistor T3 is disposed between the gate line and an auxiliary electrode line adjacent thereto. Alternatively, two or more third transistors T3 may be disposed between the gate line and an auxiliary electrode line adjacent thereto, as shown in FIG. 2(b) and FIG. 3(b).

Here, the auxiliary electrode line may be a signal line originally provided in the array substrate, or may be an additional signal line, which is not limited. On such basis, a voltage may be input in advance to the auxiliary electrode line, but the voltage is less than the minimum driving voltage of the control terminal of the second transistor T2, i.e. less than the minimum turn-on voltage of the second transistor T2 (in the case that the voltage of the control terminal of the second transistor T2 is larger than the minimum driving voltage of the control terminal, the second transistor T2 can be turned on). Alternatively, a voltage may not be input in advance to the auxiliary electrode line.

In the above embodiment, the control terminal of the first transistor T1 is electrically connected to a gate line that drives a row of pixel units in which the pixel unit is located, thus the first transistor T1 is in a turn-on state when a scanning signal is input to the gate line. The control terminal of the second transistor T2 is electrically connected to an auxiliary electrode line that drives a row of pixel units in which the pixel unit is located. Since the voltage signal input to the auxiliary electrode line is low, the second transistor T2 cannot be turned on, and the second transistor T2 is in a turn-off state. The second transistor T2 can be turned on only when the third transistor T3 is turned on under the control of the data line to which it is connected, and the voltage on the gate line is input to the auxiliary electrode line through the third transistor T3.

Based on that, the magnitude of the minimum driving voltage for driving the second transistor T2 to be turned on can be adjusted by adjusting the material of the semiconductor layer of the second transistor T2. Further, the maximum voltage allowed to pass through the third transistor T3 can be adjusted by adjusting the material of the semiconductor layer of the third transistor T3.

In the above-described array substrate provided by an embodiment of the present disclosure, since the pixel electrode 10 of each pixel unit of the array substrate is connected to both the first transistor T1 and the second transistor T2, respectively, in case one of the first transistor T1 and the second transistor T2 is in a damaged state, the pixel can be lit by the other transistor, which avoids the problem that the pixel unit is in a constantly dark or bright state, thereby effectively reducing the spot-like failures of a display panel and improving the product quality.

In an embodiment of the present disclosure, when a scanning signal is input to the gate line connected to the third transistor T3, the signal on the gate line may also be input to the auxiliary electrode line connected to the third transistor T3 through the third transistor T3. If only one third transistor T3 or a small number of third transistors T3 are disposed between the gate line and an auxiliary electrode line adjacent thereto, on the one hand, the signal on the gate line cannot be quickly input to the auxiliary electrode line through the third transistor T3, and on the other hand, due to the inherent loss of the auxiliary electrode line, the signal at a position farther from the third transistor T3 in the auxiliary electrode line is weaker, which in turn results in a non-uniform voltage input to the pixel electrode 10 on the array substrate, thereby affecting the display effect.

Therefore, in the exemplary embodiment, as shown in FIG. 2(b) and FIG. 3(b), the third transistor T3 is disposed at each intersection of the gate lines and the data lines.

It is to be noted that each intersection of the gate lines and the data lines does not refer to a specific intersection point, but refers to a certain area around the intersection point.

In the above embodiment of the present disclosure, since the third transistor T3 is disposed at an intersection of each of the gate lines and each of the data lines, that is, a plurality of third transistors are disposed between adjacent gate line and auxiliary electrode line, when a signal is input to the gate line, the signal on the gate line may be input to the auxiliary electrode line connected to the third transistor T3 through the plurality of third transistors T3.

In some embodiments of the present disclosure, as shown in FIGS. 2(a) and 2(b), the first terminal of the third transistor T3 is electrically connected to an auxiliary electrode line that drives a row of pixel units in which the pixel unit is located, and the second terminal of the third transistor T3 is electrically connected to a gate line that drives an adjacent row of pixel units.

The operating process of the array substrate will be described in detail below based on the structures of the array substrate as shown in FIGS. 2(a) and 2(b).

In one operating process of the above array substrate, referring to FIG. 2(b), gate driving signals are input to the gate lines G1, G2, . . . , Gn row by row. When a gate driving signal is input to the gate line G1, if the first transistor T1 connected to the gate line G1 is not damaged, the first transistor T1 is turned on, and the data signal on the data line D1 is input to a pixel electrode 102 through the first transistor T1. At that time, the voltage on the auxiliary electrode line C1 is less than the minimum turn-on voltage of the second transistor T2, thus the second transistor T2 is in a turn-off state. When a gate driving signal is input to the gate line G2, if the first transistor T1 connected to the gate line G2 is not damaged, the first transistor T1 is turned on, and the data signal on the data line is input to a pixel electrode 101 through the first transistor T1. At that same time, the gate driving signal on the gate line G2 is also input to the auxiliary electrode line C1 through the third transistor T3, so that the voltage on the auxiliary electrode line C1 is raised to be greater than the minimum turn-on voltage of the second transistor T2. However, since the pixel voltage of the pixel electrode 102 has been raised when the gate line G1 is turned on, although the voltage on the auxiliary electrode line C1 at that time is raised, it is less than the pixel voltage of the pixel electrode 102, that is, the voltage of the control terminal of the second transistor T2 is less than that of the second terminal of the second transistor T2 (the control terminal of the second transistor T2 is connected to the auxiliary electrode line C1, and the second terminal of the second transistor T2 is connected to the pixel electrode 102). Therefore, according to the property of the transistor, the voltage on the data line D1 cannot be input to the pixel electrode 102 through the second transistor T2.

In another case, gate driving signals are input to the gate lines G1, G2, . . . , Gn row by row. When a gate driving signal is input to the gate line G1, if the first transistor T1 connected to the gate line G1 is damaged, the first transistor T1 is turned off, and the data signal on the data line cannot be input to the pixel electrode 102 through the first transistor T1. At that time, although there is a signal on the auxiliary electrode line C1, the voltage signal on the auxiliary electrode line C1 is smaller than the minimum turn-on voltage of the second transistor T2, and therefore the second transistor T2 is also in a turn-off state. When a gate driving signal is input to the gate line G2, if the first transistor T1 connected to the gate line G2 is not damaged, the first transistor T1 is turned on. At that time, the data signal on the data line is input to the pixel electrode 101 through the first transistor T1. At the same time, the signal on the gate line G2 is also input to the auxiliary electrode line C1 through the third transistor T3, so that the voltage on the auxiliary electrode line C1 is raised to be greater than the minimum turn-on voltage of the second transistor T2, thus the second transistor T2 is turned on. Since the voltage on the data line is not input to the pixel electrode 102 when the gate line G1 is turned on, at that time, the voltage on the data line may be input to the pixel electrode 102 through the second transistor T2, so that the signal is input to the pixel electrode 101 and the pixel electrode 102 simultaneously.

In an exemplary embodiment, it is assumed that the voltage input in advance to the auxiliary electrode line is 5V, the data voltage on the data line D1 is 10V, and the gate driving voltage on the gate line G1 is 25V. When the gate driving voltage is input to the gate line G1, if the first transistor T1 is not damaged, the data voltage is input to the pixel electrode 102 through the first transistor T1. On the other hand, since the voltage of the control terminal of the second transistor T2 is 5V, which is lower than the minimum turn-on voltage (e.g. 6V) of the second transistor T2, the second transistor T2 is turned off.

In an exemplary embodiment, it is assumed that the voltage input in advance to the auxiliary electrode line is 5V, the data voltage on the data line D1 is 10V, the gate driving voltage on the gate line G2 is 25V, and the pixel voltage of the pixel electrode 102 is 8V. The auxiliary electrode line C1 is electrically connected to the control terminal of the second transistor T2. The voltage of the control terminal of the second transistor T2 is raised by the gate line G2 to 7V. However, at that time, the voltage (7V) of the control terminal of the second transistor T2 is lower than the pixel voltage (8V) of the pixel electrode 102, so the second transistor T2 is in a turn-off state. In such a case, the purpose of automatically shielding the second transistor T2 when the first transistor T1 is normal is realized.

It is assumed that the voltage input in advance to the auxiliary electrode line is 5V, the data voltage on the data line D1 is 10V, the gate driving voltage on the gate line G1 is 25V, and the first transistor T1 is damaged. The data voltage is not loaded on the pixel electrode 102. Moreover, since the voltage of the control terminal of the second transistor T2 is 5V, which is lower than the minimum turn-on voltage of the second transistor T2, the second transistor T2 is turned off.

It is assumed that the voltage input in advance to the auxiliary electrode line is 5V, the data voltage on the data line D1 is 10V, the gate driving voltage on the gate line G2 is 25V, and the pixel voltage on the pixel electrode 102 of a pixel unit not lit due to the damage of the first transistor T1 is 3V. The auxiliary electrode line C1 is electrically connected to the control terminal of the second transistor T2. When the voltage of the gate line G2 is 25V, the voltage of the control terminal of the second transistor T2 will be raised by the auxiliary electrode line to 7V. At that time, the voltage (7V) of the control terminal of the second transistor T2 is higher than the data voltage (3V) of the pixel electrode 102 and higher than the minimum turn-on voltage (6V) of the second transistor T2, thus the second transistor T2 is turned on, so that the purpose of automatically turning on the second transistor T2 when the first transistor T1 is damaged is realized.

In another operating process of the above array substrate, the gate lines G1, G2, . . . , Gn are scanned simultaneously every two rows, all the gate lines are scanned by twos in each frame, and the gate driving voltage input to the gate line Gn+1 is less than the gate driving voltage input to the gate line Gn. For example, in the first clock cycle, the gate driving signal is simultaneously input to the gate line G1 and the gate line G2, and the gate driving voltage input to the gate line G1 is larger than the gate driving voltage input to the gate line G2; in the second clock cycle, the gate driving signal is simultaneously input to the gate line G2 and the gate line G3, and the gate driving voltage input to the gate line G2 is larger than the gate driving voltage input to the gate line G3; in the third clock cycle, the gate driving signal is simultaneously input to the gate line G3 and the gate line G4, and the gate driving voltage input to the gate line G3 is larger than the gate driving voltage input to the gate line G4, and so on.

Based on an example in which the gate driving voltage is simultaneously input to the gate line G1 and the gate line G2, the gate driving voltage input to the gate line G1 is larger than the gate driving voltage input to the gate line G2. The voltage signal on the gate line G1 can turn on the first transistor T1 connected to the gate line G1, and the voltage signal on the gate line G2 can turn on the second transistor T2 connected to the auxiliary electrode line C1 through the third transistor T3, but cannot turn on the first transistor T1 connected to the gate line G2. If the first transistor T1 connected to the pixel electrode 102 is not damaged, when gate driving voltages are input to the gate line G1 and the gate line G2 simultaneously, the first transistor T1 is turned on, the data signal on the data line is input to the pixel electrode 102 through the first transistor T1, and the voltage on the gate line G2 is input to the auxiliary electrode line C1 through the third transistor T3, so that the voltage on the auxiliary electrode line C1 is raised to be greater than the minimum turn-on voltage of the second transistor T2, and the second transistor T2 connected to the auxiliary electrode line C1 is turned on, thus the voltage on the data line is input to the pixel electrode 102 through the second transistor T2. That is, the voltage on the data line is input to the pixel electrode 102 through the first transistor T1 and the second transistor T2 simultaneously.

If the first transistor T1 connected to the pixel electrode 102 is damaged, when gate driving voltages are input to the gate line G1 and the gate line G2 simultaneously, the data signal on the data line cannot be input to the pixel electrode 102 through the first transistor T1. However, at that time, the voltage on the gate line G2 is input to the auxiliary electrode line C1 through the third transistor T3, so that the voltage on the auxiliary electrode line C1 is raised to be greater than the minimum turn-on voltage of the second transistor T2, thus the second transistor T2 connected to the auxiliary electrode line C1 is turned on, so that the data voltage on the data line is input to the pixel electrode 102 through the second transistor T2, and the pixel unit corresponding to the pixel electrode 102 is lit.

In another exemplary embodiment, as shown in FIG. 3(a) and FIG. 3(b), the first terminal of the third transistor T3 is electrically connected to an auxiliary electrode line that drives a row of pixel units in which the pixel unit is located, and the second terminal of the third transistor T3 is electrically connected to a gate line that drives a row of pixel units in which the pixel unit is located.

As shown in FIG. 3(a) and FIG. 3(b), gate driving signals are input to the gate lines G1, G2, . . . , Gn row by row. When a gate driving signal is input to the gate line G1, if the first transistor T1 connected to the gate line G1 is not damaged, the first transistor T1 is turned on, and the data signal on the data line is input to the pixel electrode 10 through the first transistor T1. At the same time, the signal on the gate line is input to the auxiliary electrode line through the third transistor T3, the voltage on the auxiliary electrode line is raised to be greater than the driving voltage of the second transistor T2, the second transistor T2 is turned on, and the data signal on the data line is also input to the pixel electrode 10 through the second transistor T2.

If the first transistor T1 is damaged, the data signal on the data line will be input to the pixel electrode 10 only through the second transistor T2.

In an exemplary embodiment, the semiconductor layers of the first transistor T1, the second transistor T2, and the third transistor T3 may include an amorphous silicon ($\alpha$-Si) layer and an N-type doped layer. That is, the first transistor T1, the second transistor T2, and the third transistor T3 may be N-type transistors.

However, it is to be noted that although the operating process of the array substrate is described above based on an example in which the first transistor T1, the second transistor T2, and the third transistor T3 are N-type transistors, one or more of the first transistor T1, the second transistor T2 and the third transistor T3 may also be P-type transistors, and details are not described herein again.

In an embodiment of the present disclosure, by adjusting the doping concentration of the semiconductor layer of a transistor, the maximum voltage allowed to pass through the transistor without damaging the transistor and the minimum turn-on voltage that turns on the transistor can be adjusted.

In an exemplary embodiment, the auxiliary electrode line may be multiplexed into a common electrode line.

In such an embodiment, a voltage is input in advance to the common electrode line, but the voltage is small, which is less than the minimum turn-on voltage of the second transistor T2. Therefore, although the control terminal of the second transistor T2 is connected to the common electrode line, the second transistor T2 cannot be turned on.

In such an embodiment, by using the common electrode line as an auxiliary electrode line, there may be no need to additionally dispose an auxiliary electrode line, thereby simplifying the manufacturing process of the array substrate.

In a further aspect, an embodiment of the present disclosure provides a display device comprising any of the array substrates described above.

The display device may be a liquid crystal display device (LCD), and may also be an organic light emitting diode display device (OLED). When the display device is a liquid crystal display device, the liquid crystal display device comprises an array substrate, a counter substrate, and a liquid crystal layer disposed between the array substrate and the counter substrate. When the display device is an organic electroluminescent diode display device, the organic electroluminescent diode display device comprises an array substrate and a package cover.

The display device may be any device that displays both moving (e.g. video) and stationary (e.g. still image) objects as well as texts and images. More specifically, it is contemplated that the above-described embodiments may be implemented in or associated with a variety of electronic devices such as, but not limited to, a mobile phone, a wireless device, a personal data assistant (PDA), handheld or portable computer, a GPS receiver/navigator, a camera, a MP4 video player, a video camera, a game console, a watch, a clock, a calculator, a TV monitor, a flat panel display, a computer monitor, a car display (e.g. mileage table display, etc.), a navigator, a cockpit controller and/or display, a camera view display (e.g. a rear view camera display in a vehicle), an electronic photo, an electronic billboard or signage, a projector, a building structure, a packaging and aesthetic structure (for example, a display for an image of a piece of jewelry), and the like. Further, the display device may also be a display panel.

An embodiment of the present disclosure provides a display device comprising the array substrate described above. Since the pixel electrode 10 of each pixel unit of the array substrate is connected to the first transistor T1 and the second transistor T2, respectively, in case one of the first transistor T1 and the second transistor T2 is in a damaged state, the pixel can be lit by the other transistor, which thus avoids the problem that the pixel is in a constantly dark or bright state, thereby effectively reducing the spot-like failures and improving the product quality.

An embodiment of the present disclosure further provides a manufacturing method for an array substrate. FIG. 4 illustrates a flow chart of the manufacturing method.

Figure 5:
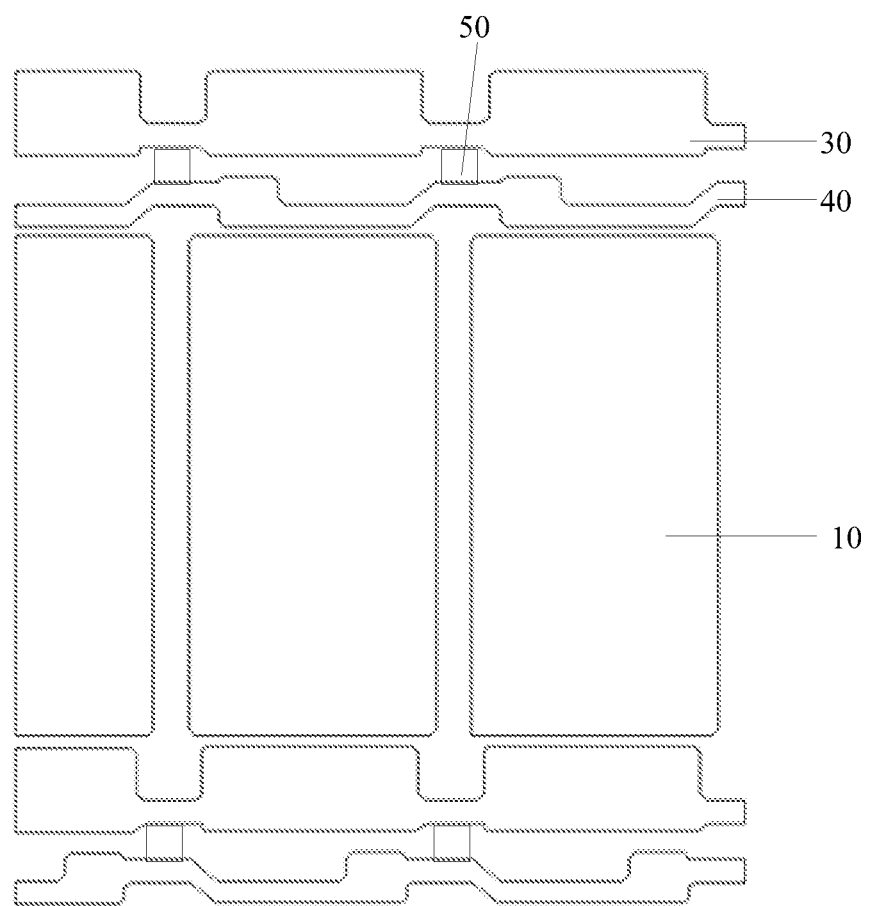
FIG. 5 is a schematic structural view illustrating formation of a first conductive layer and a second semiconductor layer on a base substrate as provided by an embodiment of the present disclosure.
Figure 7:
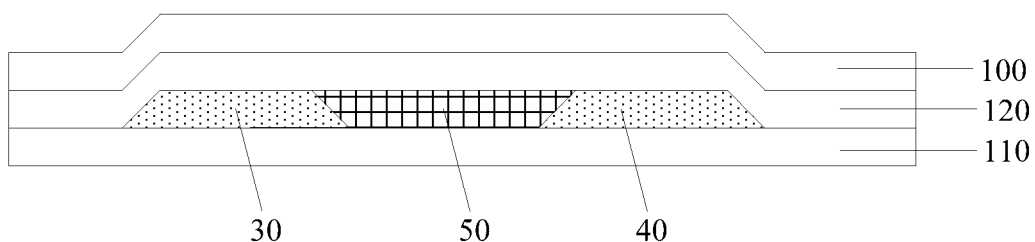
FIG. 7 (a) is a sectional view taken along line AA in FIG. 6.
Figure 7:
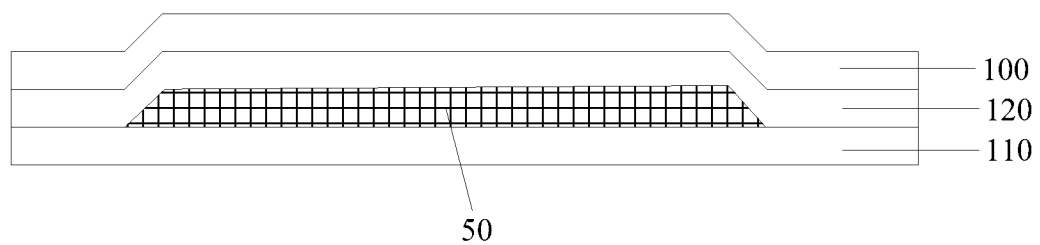

As shown in FIG. 4, at step S100, as shown in FIGS. 5 and 7(a), a first conductive layer and a second semiconductor layer are formed on a base substrate 110 (which may be, for example, a glass substrate). The first conductive layer includes a plurality of gate lines 30 and a plurality of auxiliary electrode lines 40 alternately arranged. The second semiconductor layer includes a plurality of third semiconductor patterns 50. The third semiconductor pattern 50 is formed between a gate line 30 and an auxiliary electrode line 40 adjacent thereto, and is in electrical contact with the gate line 30 and the auxiliary electrode line 40.

In step S100, the first conductive layer may be formed first, and then the second semiconductor layer is formed. Alternatively, the second semiconductor layer may be formed first, and then the first conductive layer is formed. No limitation is imposed in this regard. In addition, the auxiliary electrode lines 40 in the first conductive layer may be originally provided in the array substrate (for example, common electrode line), or may be additionally provided.

In addition, the material of the third semiconductor pattern 50 is not limited. In an exemplary embodiment, the third semiconductor pattern 50 may be composed of an amorphous silicon layer and a doped layer. Specifically, the formation process of the third semiconductor pattern 50 may be: first depositing an amorphous silicon film and a doped film on the base substrate, and then forming the third semiconductor pattern 50 by a patterning process.

It is to be noted that, since the gate lines 30 and the auxiliary electrode lines 40 are alternately arranged, except for the outermost gate line and auxiliary electrode line, each gate line has two adjacent auxiliary electrode lines, and each auxiliary electrode line has two adjacent gate lines. A third semiconductor pattern 50 is formed between the gate line 30 and an auxiliary electrode line 40 adjacent thereto. The third semiconductor pattern 50 may be disposed between the gate line 30 that drives a row of pixel units in which the pixel unit is located and the auxiliary electrode line 40 that drives a row of pixel units in which the pixel unit is located, or disposed between the auxiliary electrode line 40 that drives a row of pixel units in which the pixel unit is located and the gate line 30 that drives an adjacent row of pixel units.

At an optional step S101, as shown in FIG. 7(a) and FIG. 7(b), a gate insulating (GI) layer 120 is formed on the base substrate 110.

The material of the gate insulating layer 120 is not limited, which may be, for example, at least one of silicon nitride (SiNx), silicon oxide (SiOx) and silicon oxynitride (SiOxNy).

Figure 6:
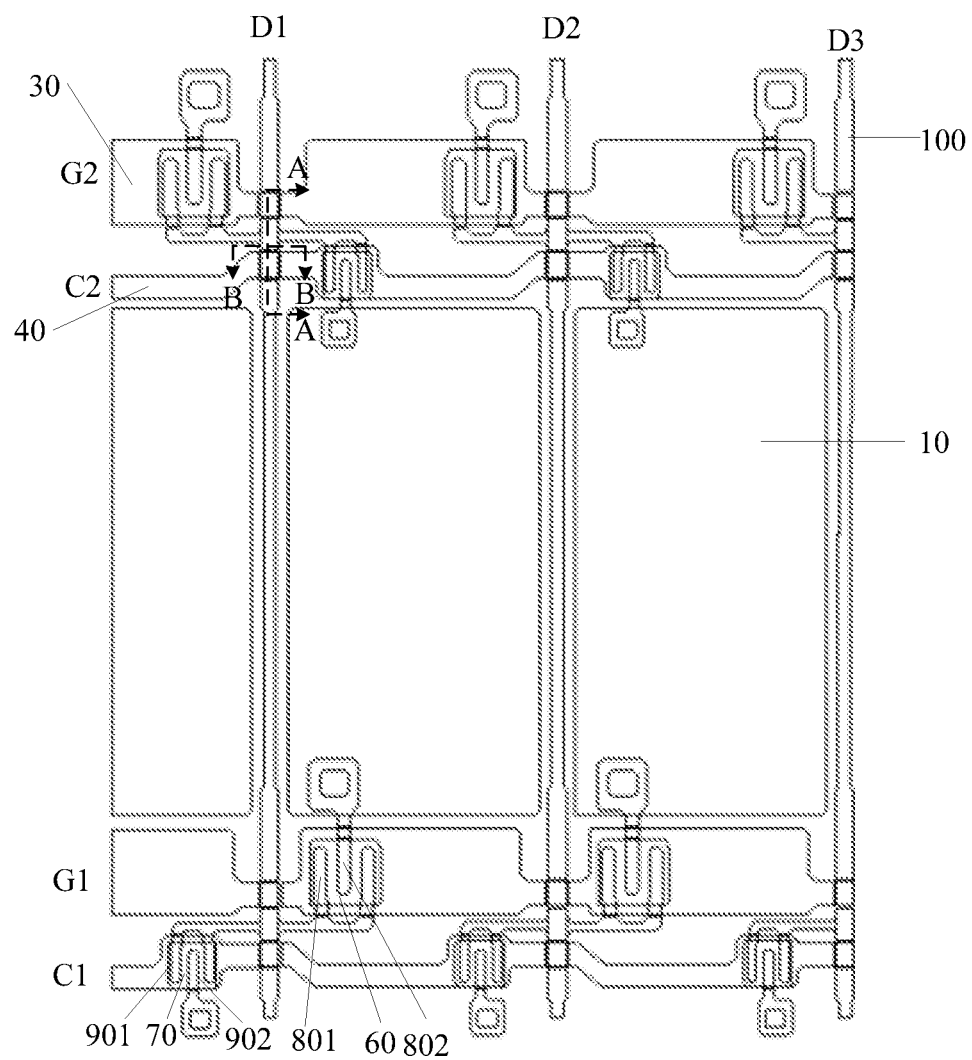
FIG. 6 is a schematic structural view illustrating formation of a first conductive layer, a second semiconductor layer, a first semiconductor layer, and a second conductive layer on a base substrate as provided by an embodiment of the present disclosure.
Figure 8:
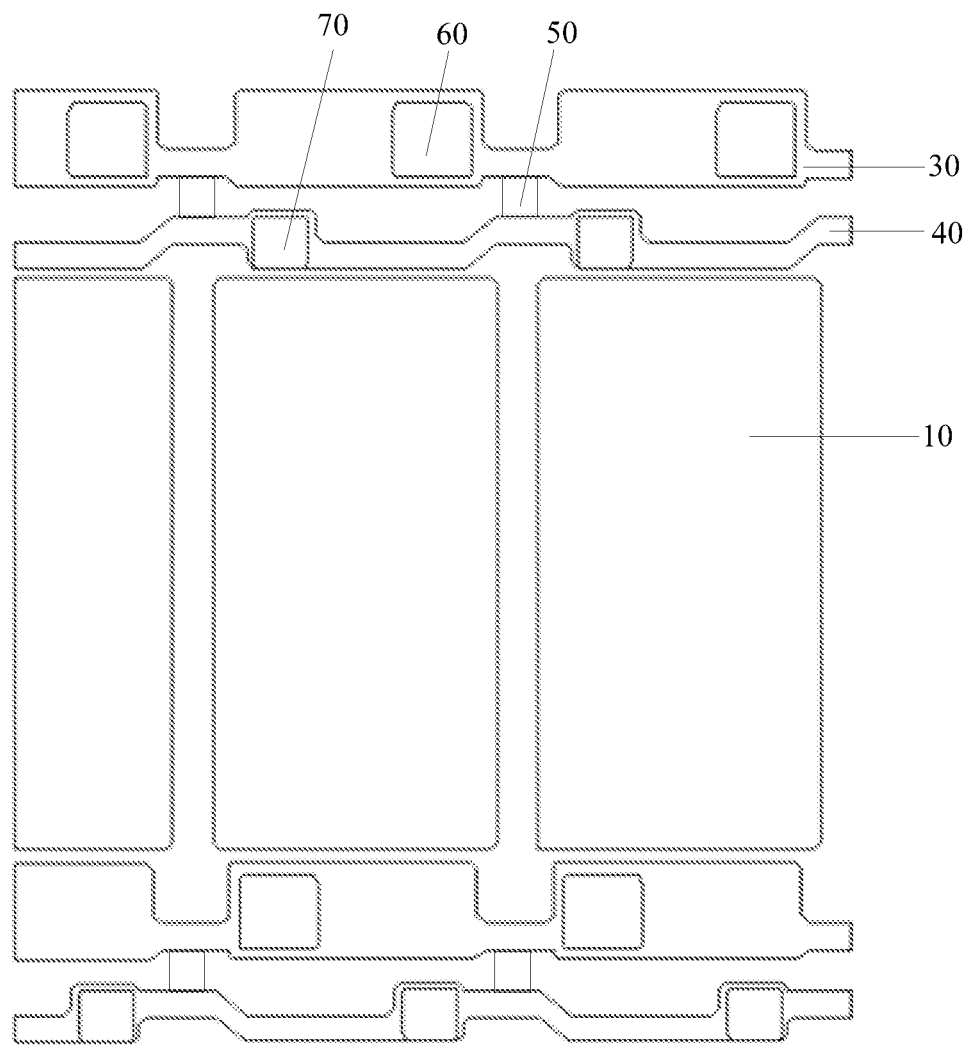
FIG. 8 is a schematic structural view illustrating formation of a first conductive layer, a second semiconductor layer, and a first semiconductor layer on a base substrate as provided by an embodiment of the present disclosure.

At step S102, as shown in FIG. 6, a first semiconductor layer and a second conductive layer are formed. Specifically, as shown in FIG. 8, the first semiconductor layer includes a plurality of first semiconductor patterns 60 and a plurality of second semiconductor patterns 70. Orthographic projections of the first semiconductor pattern 60 and the gate line 30 on the base substrate 110 overlap each other, and orthographic projections of the second semiconductor pattern 70 and the auxiliary electrode line 40 on the base substrate 110 overlap each other. The second conductive layer includes a first source 801, a first drain 802, a second source 901, a second drain 902, and a plurality of data lines 100 intersecting the extension direction of the gate lines 30. The first source 801 and the first drain 802 are both in electrical contact with the first semiconductor pattern 60, and the second source 901 and the second drain 902 are both in electrical contact with the second semiconductor pattern 70. Orthographic projections of the data line 100 and the third semiconductor pattern 50 on the base substrate 110 overlap each other.

FIG. 7(a) and FIG. 7(b) are sectional views taken along line AA and line BB in FIG. 6 respectively to illustrate the structure of the array substrate in detail.

In an exemplary embodiment, as shown in FIG. 8, the first semiconductor layer is formed first, and the second conductive layer is formed. Alternatively, the second conductive layer may be formed first, and the first semiconductor layer is formed. No limitation is imposed in this regard.

In the above embodiment, the first source 801, the first drain 802 and the first semiconductor pattern 60 constitute the first transistor T1, the second source 901, the second drain 902 and the second semiconductor pattern 70 constitute the second transistor T2, and the third semiconductor pattern 50 and portions of the gate line 30 and the auxiliary electrode line 40 that are in electrical contact with the third semiconductor pattern 50 constitute the third transistor T3, as shown in FIG. 7(a).

In an exemplary embodiment, the formation process of the second conductive layer may specifically be: first depositing a second conductive layer film on the base substrate, and then forming the first source 801, the first drain 802, the second source 901, the second drain 902 and the data line 100 by a patterning process. The materials of the first semiconductor pattern 60 and the second semiconductor pattern 70 are not limited. In an exemplary embodiment, the first semiconductor pattern 60 and the second semiconductor pattern 70 may be composed of an amorphous silicon layer and a doped layer. Specifically, an amorphous silicon film and a doped film may be first deposited on the base substrate, and the first semiconductor pattern 60 and the second semiconductor pattern 70 are then formed by a patterning process.

In an exemplary embodiment, after forming the first semiconductor layer and the second conductive layer, the above method may further comprise forming a passivation layer (PVX) and a common electrode.

An embodiment of the present disclosure provides a manufacturing method for an array substrate. In an array substrate manufactured by the method, since each pixel unit of the array substrate includes the first transistor T1 and the second transistor T2, and the first transistor T1 and the second transistor T2 are both electrically connected to the pixel electrode 10, in case one of the first transistor T1 and the second transistor T2 is in a damaged state, the pixel can be lit by the other transistor, which thus avoids the problem that the pixel is in a constantly dark or bright state, thereby effectively reducing the spot-like failures and improving the product quality.

Optionally, as shown in FIG. 5, prior to forming the first conductive layer and the second semiconductor layer on the base substrate, the above manufacturing method may further comprise forming a third conductive layer on the base substrate, the third conductive layer including a plurality of pixel electrodes 10. The pixel electrode 10 is electrically connected to both a first drain 802 and a second drain 902 to be formed.

Alternatively, after the first semiconductor layer and the second conductive layer are formed on the base substrate, the above-described manufacturing method may further comprise forming a third conductive layer, the third conductive layer including a plurality of pixel electrodes 10. The pixel electrode 10 is electrically connected to both the first drain 802 and the second drain 902.

The material of the pixel electrode 10 may include at least one of ITO (Indium Tin Oxide) and IZO (Indium Zinc Oxide).

The formation process of the third conductive layer may specifically include first forming a third conductive film on the base substrate, and then forming pixel electrodes by a patterning process.

In an exemplary embodiment, forming a third semiconductor pattern 50 between a gate line 30 and an auxiliary electrode line 40 adjacent thereto includes: forming a plurality of third semiconductor patterns 50 between the auxiliary electrode line 40 that drives a row of pixel units in which the pixel unit is located and the gate line 30 that drives an adjacent row of pixel units.

Orthographic projections of each of the third semiconductor patterns 50 and the data line 100 on the base substrate 110 overlap each other. When a signal passes through the data line 100, the third transistor including the third semiconductor patterns 50 is turned on.

In the above embodiment, since a plurality of third semiconductor patterns 50 are formed between the auxiliary electrode line 40 that drives a row of pixel units in which the pixel unit is located and the gate line 30 that drives an adjacent row of pixel units, and the third semiconductor patterns 50 are in electrical contact with both the gate line 30 and the auxiliary electrode line 40, when the third transistor including the third semiconductor patterns 50 is turned on, the signal on the gate line 30 may be input to the auxiliary electrode line 40 through the plurality of third semiconductor patterns 50.

As shown in FIG. 2(a) and FIG. 2(b), when the first terminal of the third transistor T3 of the array substrate is electrically connected to the auxiliary electrode line 40 that drives a row of pixel units in which the pixel unit is located, and the second terminal of the third transistor T3 of the array substrate is electrically connected to the gate line 30 that drives an adjacent row of pixel units, an embodiment of the present disclosure further provides a driving method for an array substrate, comprising: inputting a data signal to the pixel electrode 10 connected to the first transistor T1 and the second transistor T2 through the first transistor T1 and/or the second transistor T2.

In such an embodiment, the data signal may be input to the pixel electrode 10 connected to the first transistor T1 and the second transistor T2 through the first transistor T1 and the second transistor T2 simultaneously, or the data signal may be input to the pixel electrode 10 connected to the first transistor T1 and the second transistor T2 through the first transistor T1 or the second transistor T2.

In the above-described driving method for an array substrate provided by an embodiment of the present disclosure, since the pixel electrode 10 of each pixel unit of the array substrate is connected to both the first transistor T1 and the second transistor T2, in case one of the first transistor T1 and the second transistor T2 is in a damaged state, the pixel can be lit by the other transistor, which thus avoids the problem that the pixel is in a constantly dark or bright state, thereby effectively reducing the spot-like failures and improving the product quality.

In an exemplary embodiment, the gate lines are progressively scanned, and inputting a data signal to the pixel electrode 10 connected to the first transistor T1 and the second transistor T2 through the first transistor T1 and/or the second transistor T2 includes: inputting a data signal to the pixel electrode 10 connected to the first transistor T1 and the second transistor T2 through the first transistor T1 or the second transistor T2.

Referring to FIG. 2(a) and FIG. 2(b), gate driving signals are input to the gate lines G1, G2, . . . , Gn row by row. When a gate driving signal is input to the gate line G1, if the first transistor T1 connected to the gate line G1 is not damaged, the first transistor T1 is turned on, and the data signal on the data line is input to the pixel electrode 102 through the first transistor T1. At that time, the voltage on the auxiliary electrode line C1 is less than the minimum turn-on voltage of the second transistor T2, thus the second transistor T2 is in a turn-off state. When a gate driving signal is input to the gate line G2, if the first transistor T1 connected to the gate line G2 is not damaged, the first transistor T1 is turned on, and the data signal on the data line is input to the pixel electrode 101 through the first transistor T1. At the same time, the gate driving signal on the gate line G2 is further input to the auxiliary electrode line C1 through the third transistor T3, so that the voltage on the auxiliary electrode line C1 is raised to be greater than the minimum turn-on voltage of the second transistor T2. However, since the pixel voltage of the pixel electrode 102 has been raised when the gate line G1 is turned on, although the voltage on the auxiliary electrode line C1 at that time is raised, it is less than the pixel voltage of the pixel electrode 102. That is, the voltage of the control terminal of the second transistor T2 is less than that of the second terminal of the second transistor T2 (the control terminal of the second transistor T2 is connected to the auxiliary electrode line C1, and the second terminal of the second transistor T2 is connected to the pixel electrode 102). Therefore, according to the property of the transistor, the voltage on the data line cannot be input to the pixel electrode 102 through the second transistor T2.

On the other hand, if the first transistor T1 connected to the gate line G1 is damaged, the first transistor T1 is turned off, and the data signal on the data line cannot be input to the pixel electrode 102 through the first transistor T1. At that time, although there is a signal on the auxiliary electrode line C1, the voltage signal on the auxiliary electrode line C1 is smaller than the minimum turn-on voltage of the second transistor T2, thus the second transistor T2 is also in a turn-off state. When a gate driving signal is input to the gate line G2, if the first transistor T1 connected to the gate line G2 is not damaged, the first transistor T1 is turned on. At that time, the data signal on the data line is input to the pixel electrode 101 through the first transistor T1. At the same time, the signal on the gate line G2 is further input to the auxiliary electrode line C1 through the third transistor T3, so that the voltage on the auxiliary electrode line C1 is raised to be greater than the minimum turn-on voltage of the second transistor T2, thus the second transistor T2 is turned on. Since the voltage on the data line is not input to the pixel electrode 102 when the gate line G1 is turned on, at that time, the voltage on the data line can be input to the pixel electrode 102 through the second transistor T2, so that the signal is input to the pixel electrode 101 and the pixel electrode 102 at the same time.

In the above embodiment, for the pixel electrode 101, in case the first transistor T1 is not damaged, the signal is input to the pixel electrode 101 through the first transistor T1 connected to the pixel electrode 101. In case the first transistor T1 is damaged, the signal is input to the pixel electrode 101 through the second transistor T2 connected to the pixel electrode 101.

In another exemplary embodiment, gate driving signals are input to a gate line and another gate line adjacent to the gate line simultaneously, and inputting the data signal to the pixel electrode connected to the first transistor T1 and the second transistor T2 through the first transistor T1 and/or the second transistor T2 includes: inputting the data signal to the same pixel electrode 10 connected to the first transistor T1 and the second transistor T2 through the first transistor T1 and the second transistor T2. The voltage of the gate driving signal input to the gate line is larger than the voltage of the gate driving signal input to said another gate line adjacent to the gate line. The voltage signal on the gate line is configured to turn on the first transistor T1 connected to the gate line, and the voltage signal on said another gate line adjacent to the gate line is configured to turn on the second transistor T2 through the third transistor T3.

It is to be noted that although gate scanning signals are input to a gate line and another gate line adjacent to the gate line simultaneously, the data signal is only input to the pixel electrode 101 in a row of pixel units driven by the gate line through the first transistor T1 and the second transistor T2 connected to the pixel electrode 101, and the data signal cannot be input to the pixel electrodes 10 in other rows of pixel units because the voltage of the gate driving signal input to said another gate line adjacent to the gate line is lower than the minimum turn-on voltage of the first transistor T1 connected to said another gate line.

It is to be noted that inputting the data signal to the same pixel electrode 10 connected to the first transistor T1 and the second transistor T2 through the first transistor T1 and the second transistor T2 means that, neither of the first transistor T1 and the second transistor T2 is damaged. When the first transistor T1 or the second transistor T2 is damaged, the data signal can only be input to the pixel electrode 10 through the other transistor not damaged.

Taking inputting gate scanning signals to the gate line G1 and the gate line G2 simultaneously as an example, the voltage signal on the gate line G1 is larger than the voltage signal on the gate line G2, the voltage signal on the gate line G1 can turn on the first transistor T1 connected to the gate line G1, and the voltage signal on the gate line G2 can turn on the second transistor T2 connected to the auxiliary electrode line C1 through the third transistor T3, but cannot turn on the first transistor T1 connected to the gate line G2. If the first transistor T1 connected to the pixel electrode 102 is not damaged, when gate scanning signals are input to the gate line G1 and the gate line G2 simultaneously, the first transistor T1 is turned on, and the data signal on the data line is input to the pixel electrode 102 through the first transistor T1. At the same time, the voltage signal on the gate line G2 is input to the auxiliary electrode line C1 through the third transistor T3, so that the voltage on the auxiliary electrode line C1 is raised to be greater than the minimum turn-on voltage of the second transistor T2, and the second transistor T2 connected to the auxiliary electrode line C1 is turned on, thus the voltage on the data line is input to the pixel electrode 102 through the second transistor T2. That is, the voltage on the data line is input to the pixel electrode 102 through the first transistor T1 and the second transistor T2 simultaneously.

If the first transistor T1 connected to the pixel electrode 102 is damaged, when gate scanning signals are input to the gate line G1 and the gate line G2 simultaneously, the data signal on the data line cannot be input to the pixel electrode 102 through the first transistor T1. However, at that time, the voltage on the gate line G2 is input to the auxiliary electrode line C1 through the third transistor T3, so that the voltage on the auxiliary electrode line C1 is raised to be greater than the minimum turn-on voltage of the second transistor T2, and the second transistor connected to the auxiliary electrode line C1 is turned on, thus the data voltage on the data line is input to the pixel electrode 102 through the second transistor T2, thereby lighting the pixel unit where the pixel electrode 102 is located.

In embodiments of the present disclosure, when the gate lines are scanned row by row or a gate line and another gate line adjacent to the gate line are simultaneously scanned, the data signal may be input to the pixel electrode 10 connected to the first transistor T1 and the second transistor T2 through the first transistor T1 and/or the second transistor T2, which avoids the problem that the pixel is in a constantly dark or bright state when the first transistor T1 connected to the pixel electrode 10 is damaged.

As will be appreciated by those skilled in the art, although the concept of the present disclosure is described above by taking an N-type transistor as an example, the present disclosure is not so limited. One or more of the first transistor, the second transistor, and the third transistor may be P-type transistors. Since the turn-on condition for a P-type transistor is opposite to that for an N-type transistor, in the case of employing a P-type transistor, the voltage signal on the gate line G1 being larger than the voltage signal on the gate line G2 means that the absolute value of the voltage signal on the gate line G1 is larger than the absolute value of the voltage signal on the gate line G2.

What have been stated above are merely specific embodiments of the present disclosure, but the scope of the present disclosure is not so limited. Any variations or substitutions that can be easily conceived by the skilled person familiar with this technical field within the technical scope revealed by the present disclosure shall be encompassed within the scope of the present disclosure. Therefore, the protection scope of the present disclosure should be based on by the scope of the claims.

The invention claimed is:

1. An array substrate comprising:
   a plurality of gate lines extending along a first direction,
   a plurality of data lines extending along a second direction intersecting the first direction,
   a plurality of pixel units at intersections of the plurality of gate lines and the plurality of data lines, and
   a plurality of auxiliary electrode lines arranged alternately with the plurality of gate lines and extending along the first direction, wherein each pixel unit comprises a first transistor, a second transistor, and a pixel electrode,
wherein a control terminal of the first transistor is electrically connected to a corresponding gate line of the plurality of gate lines that drives a row of pixel units in which a corresponding pixel unit is located,
wherein a first terminal of the first transistor is electrically connected to a data line of the plurality of data lines,
wherein a second terminal of the first transistor is electrically connected to the pixel electrode,
wherein a control terminal of the second transistor is electrically connected to an auxiliary electrode line that drives the row of pixel units in which the corresponding pixel unit is located,
wherein a first terminal of the second transistor is electrically connected to the data line,
wherein a second terminal of the second transistor is electrically connected to the pixel electrode,
wherein the array substrate further comprises a third transistor between each gate line and an auxiliary electrode line adjacent thereto,
wherein a control terminal of the third transistor is electrically connected to the data line,
wherein a first terminal of the third transistor is electrically connected to the gate line, and
wherein a second terminal of the third transistor is electrically connected to the auxiliary electrode line.

2. The array substrate according to claim 1, wherein the third transistor is at the intersections of the plurality of gate lines and the plurality of data lines.

3. The array substrate according to claim 1,
wherein the first terminal of the third transistor is electrically connected to the auxiliary electrode line that drives a row of pixel units in which the pixel unit is located, and
wherein the second terminal of the third transistor is electrically connected to a gate line of the plurality of gate lines that drives an adjacent row of pixel units.

4. The array substrate according to claim 1,
wherein the first terminal of the third transistor is electrically connected to the auxiliary electrode line that drives a row of pixel units in which the pixel unit is located, and
wherein the second terminal of the third transistor is electrically connected to the corresponding gate line that drives a row of pixel units in which the pixel unit is located.

5. The array substrate according to claim 1,
wherein a semiconductor layer of at least one of the first transistor, the second transistor, or the third transistor comprises an amorphous silicon layer and a doped layer.

6. The array substrate according to claim 1, wherein the auxiliary electrode line is multiplexed into a common electrode line.

7. A display device comprising the array substrate according to claim 1.

8. A driving method for the array substrate according to claim 1, comprising:
inputting a data signal to a pixel electrode connected to the first transistor and the second transistor through at least one of the first transistor and the second transistor.

9. The driving method according to claim 8,
wherein the first terminal of the third transistor is electrically connected to an auxiliary electrode line that drives a row of pixel units in which the pixel unit is located, and
wherein the second terminal of the third transistor is electrically connected to a gate line of the plurality of gate lines that drives an adjacent row of pixel units.

10. The driving method according to claim 9,
wherein gate scanning signals are input to the plurality of gate lines row by row, and
wherein inputting a data signal to a pixel electrode connected to the first transistor and the second transistor through at least one of the first transistor and the second transistor comprises inputting a data signal to the pixel electrode connected to the first transistor and the second transistor through the first transistor or the second transistor.

11. The driving method according to claim 9,
wherein gate scanning signals are input to each gate line and another gate line adjacent to the each gate line simultaneously,
wherein inputting a data signal to a pixel electrode connected to a first transistor and a second transistor through at least one of the first transistor and the second transistor comprises inputting a data signal to the pixel electrode connected to the first transistor and the second transistor through both the first transistor and the second transistor in response to the first transistor being undamaged, and inputting a data signal to the pixel electrode connected to the first transistor and the second transistor through the second transistor in response to the first transistor being damaged.

12. The driving method according to claim 11,
wherein an absolute value of a voltage of a gate scanning signal input to the gate line is larger than an absolute value of a voltage of a gate scanning signal input to said another gate line,
wherein the voltage of the gate scanning signal input is configured to turn on the first transistor connected to the gate line, and
wherein the absolute value of the voltage of the gate scanning signal input to said another gate line is configured to turn on the second transistor through the third transistor, and not to turn on the first transistor connected to said another gate line.

13. The driving method according to claim 8,
wherein the first terminal of the third transistor is electrically connected to an auxiliary electrode line that drives a row of pixel units in which the pixel unit is located, and
wherein the second terminal of the third transistor is electrically connected to a gate line that drives a row of pixel units in which the pixel unit is located.

14. The driving method according to claim 13,
wherein gate scanning signals are input to the plurality of gate lines row by row, and
wherein inputting a data signal to the pixel electrode connected to the first transistor and the second transistor through at least one of the first transistor and the second transistor comprises inputting a data signal to the pixel electrode connected to the first transistor and the second transistor through both the first transistor and the second transistor in response to the first transistor being undamaged, and inputting a data signal to the pixel electrode connected to the first transistor and the second transistor through the second transistor in response to the first transistor being damaged.

15. The array substrate according to claim 1, wherein a third transistor is at an intersection of a gate line and a data line, and is connected to a same data line as that to which the first transistor and the second transistor of the pixel unit are connected.

16. The array substrate according to claim 15, wherein the third transistor is on a first side of the data line, and the first transistor and the second transistor are on a second side of the data line opposite to the first side along the first direction.

17. The array substrate according to claim 1, wherein for each pixel unit, an auxiliary electrode line connected to the pixel unit is on a first side of the pixel unit, and a gate line connected to the pixel unit is on a second side of the pixel unit opposite to the first side along the second direction.

18. A manufacturing method for an array substrate, comprising:
forming a first conductive layer and a second semiconductor layer on a base substrate, wherein the first conductive layer comprises a plurality of gate lines and a plurality of auxiliary electrode lines alternately arranged, wherein the second semiconductor layer comprises a third semiconductor pattern between each gate line and an auxiliary electrode line adjacent thereto, wherein the third semiconductor pattern is in electrical contact with both the gate line and the auxiliary electrode line; and
forming a first semiconductor layer and a second conductive layer, wherein the first semiconductor layer comprises a plurality of first semiconductor patterns and a plurality of second semiconductor patterns, wherein an orthographic projection of the first semiconductor pattern on the base substrate overlaps an orthographic projection of the gate line on the base substrate,
wherein an orthographic projection of the second semiconductor pattern on the base substrate overlaps an orthographic projection of the auxiliary electrode line on the base substrate,
wherein the second conductive layer comprises a first source, a first drain, a second source, a second drain, and a plurality of data lines intersecting extension directions of the plurality of gate lines,
wherein the first source and the first drain are both in electrical contact with the first semiconductor pattern,
wherein the second source and the second drain are both in electrical contact with the second semiconductor pattern, and
wherein an orthographic projection of the data line on the base substrate overlaps an orthographic projection of the third semiconductor pattern on the base substrate.

19. The manufacturing method according to claim 18, wherein prior to forming the first conductive layer and the second semiconductor layer on the base substrate, the manufacturing method further comprises:
forming a third conductive layer on the base substrate, the third conductive layer comprising a plurality of pixel electrodes which are electrically connected to a corresponding first drain and a corresponding second drain.

20. The manufacturing method according to claim 18, wherein the third semiconductor pattern is formed by operations comprising:
forming the third semiconductor pattern at each intersection of the plurality of gate lines and the plurality of data lines.

* * * * *